United States Patent
Paiga et al.

(10) Patent No.: US 11,825,745 B2
(45) Date of Patent: Nov. 21, 2023

(54) THERMOELECTRIC ELEMENT AND METHOD OF MAKING THE SAME

(71) Applicant: MicroPower Global Limited, Tortola (VG)

(72) Inventors: Cameron N. Paiga, Kyle, TX (US); Aruna R. Dedigama, San Marcos, TX (US); Alan H. Henderson, Austin, TX (US); Thomas E. Zirkle, Scottsdale, AZ (US)

(73) Assignee: MICROPOWER GLOBAL LIMITED, Tortola (VG)

( * ) Notice: Subject to any disclaimer, the term of this patent is extended or adjusted under 35 U.S.C. 154(b) by 0 days.

(21) Appl. No.: 17/313,931

(22) Filed: May 6, 2021

(65) Prior Publication Data
US 2021/0351334 A1    Nov. 11, 2021

Related U.S. Application Data

(60) Provisional application No. 63/022,229, filed on May 8, 2020.

(51) Int. Cl.
*H10N 10/17* (2023.01)
*H10N 10/82* (2023.01)
*H10N 10/852* (2023.01)

(52) U.S. Cl.
CPC ............. *H10N 10/17* (2023.02); *H10N 10/82* (2023.02); *H10N 10/852* (2023.02)

(58) Field of Classification Search
CPC ......... H01L 35/10; H01L 35/16; H01L 35/32; H10N 10/17; H10N 10/852; H10N 10/82
See application file for complete search history.

(56) References Cited

U.S. PATENT DOCUMENTS

| | | | |
|---|---|---|---|
| 3,859,143 A | 1/1975 | Krebs | |
| 6,906,449 B2 | 6/2005 | Kucherov | |
| 7,109,408 B2 | 9/2006 | Kucherov | |
| 7,569,763 B2 | 8/2009 | Kucherov | |
| 9,871,179 B2 | 1/2018 | Matsunami | |
| 10,454,913 B2 | 10/2019 | Zirkle | |
| 2005/0081906 A1* | 4/2005 | Adachi | C04B 35/6262 136/238 |
| 2013/0152990 A1 | 6/2013 | Lai | |

(Continued)

FOREIGN PATENT DOCUMENTS

| | | |
|---|---|---|
| KR | 20170076358 A | 7/2017 |
| WO | 2017136793 A1 | 7/2017 |

OTHER PUBLICATIONS

D. Crane et al., "Development of a Scalable 10% Efficient Thermoelectric Generator," Deer Conference, Detroit, MI, Aug. 15. 2007, 22 pgs.

(Continued)

*Primary Examiner* — Golam Mowla
(74) *Attorney, Agent, or Firm* — Abel Schillinger, LLP

(57) ABSTRACT

A thermoelectric element can comprise a thermoelectric body and a multi-layer contact structure. The multi-layer contact structure can contain a first metal layer overlying a surface of the thermoelectric body and a second metal layer directly overlying the first metal layer, wherein the first metal layer and the second metal layer include the same metal, and the first metal layer has a different phase than the second metal layer.

16 Claims, 4 Drawing Sheets

(56) References Cited

U.S. PATENT DOCUMENTS

2017/0194546 A1 7/2017 Fidrosy
2021/0006376 A1 1/2021 Fleurial

OTHER PUBLICATIONS

Bonian Hu et al., "Effect of Bath pH and Stabilizer on Electroless Nickel Plating of Magnesium Alloys," Surface and Coatings Technology, vol. 228, 2013, pp. 84-91.
Hiroshi Matsubara et al., "The Observation of the Nucleation and Growth of Electrolessly Plated Nickel Deposited From Different pH by TEM and QCM Method," Electrochimica Acta, vol. 52, 2006, pp. 402-407.
Armelie M. Vardelle et al., "Thermal Spray Coatings," J. Webster (ed.), Wiley Encyclopedia of Electrical and Electronics Engineering, Copyright 2007, John Wiley & Sons, Inc., 22 pgs.
Mike Zecchino et al., "Thin Film Stress Measurement Using Dektak Stylus Profilers," Veeco Instruments Inc., 2004, 4 pgs.

\* cited by examiner

THERMOELECTRIC ELEMENT AND METHOD OF MAKING THE SAME

CROSS-REFERENCE TO RELATED APPLICATION(S)

This application claims priority under 35 U.S.C. § 119(e) to U.S. Provisional Application No. 63/022,229, entitled "THERMOELECTRIC ELEMENT AND METHOD OF MAKING THE SAME," by Cameron N. PAIGA et al., filed May 8, 2020, which application is assigned to the current assignee hereof and incorporated herein by reference in its entirety.

FIELD OF THE DISCLOSURE

The present disclosure relates to a thermoelectric element, specifically to a thermoelectric element comprising a multi-layer contact structure, and a method of making the thermoelectric element.

BACKGROUND

Thermoelectric elements are known for converting heat energy to electrical energy. Typically, a temperature gradient is formed between two opposite sides of a thermoelectric element, and the heat flow from the hot side to the cold side creates a voltage that can be trapped for operating an electrical device or being stored. In order to make efficient thermoelectric elements, an important aspect is a stable contact structure between the thermoelectric material and the heat source/cooling device which can survive tough mechanical and thermal conditions.

There exists a need to improve the contact structure of thermoelectric elements to increase the efficiency, stability, and life-time of thermoelectric elements.

BRIEF DESCRIPTION OF THE DRAWINGS

The present disclosure may be better understood, and its numerous features and advantages made apparent to those skilled in the art by referencing the accompanying drawings.

DETAILED DESCRIPTION

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus.

As used herein, and unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Various embodiments of the present disclosure will now be described, by way of example only, with reference to the accompanying drawings.

The present disclosure relates to a thermoelectric element comprising a thermoelectric body and a multi-layer contact structure. The multi-layer contact structure can provide enhanced performance and prolonged lifetime of the thermoelectric element.

Figure 1A:
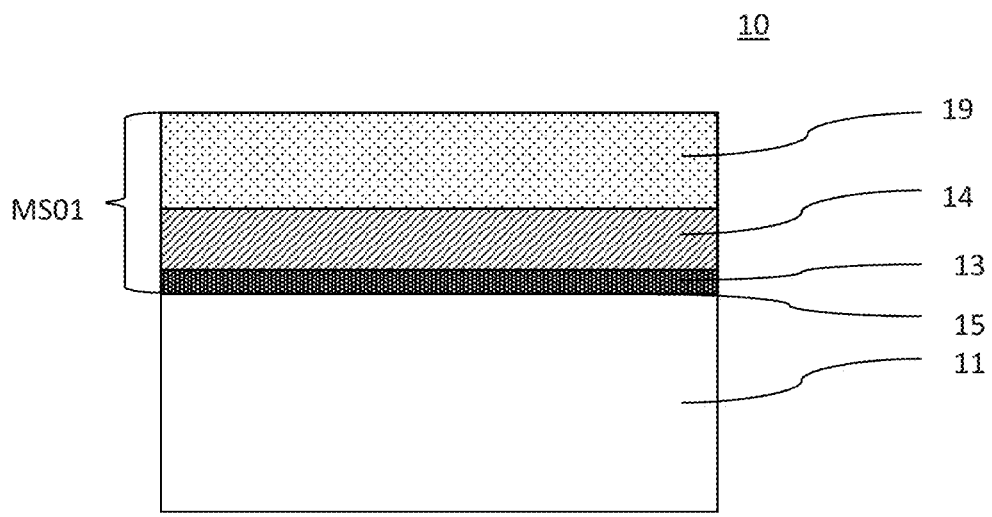
FIG. 1A includes an illustration of a thermoelectric element according to one embodiment.

In one embodiment, as illustrated in FIG. 1A, the thermoelectric element (10) can comprise a thermoelectric body (11) and a first multi-layer contact structure (MS01). The first multi-layer contact structure (MS01) may include a first metal layer (13) and a second metal layer (14), wherein the first metal layer (13) is overlying a first surface (15) of the thermoelectric body (11), and the second metal layer (14) directly overlies the first metal layer (13). In one aspect, a second multi-layer contact structure (MS02), not shown, having the same layer structure as the first multi-layer contact structure (MS01) can overly the surface at the opposite side of the thermoelectric body.

The thermoelectric body (11) of the thermoelectric element of the present disclosure can contain any thermoelectric material suitable for converting thermal energy to electrical energy.

In one embodiment, the thermoelectric body (11) can be an n-type semiconductor material. In a particular aspect, the n-type semiconductor material can include lead telluride (PbTe).

In another embodiment, the thermoelectric body (11) can be a p-type semiconductor material. In a certain aspect, the p-type semiconductor material can be a material including tellurium/antimony/germanium/silver (Te/Sb/Ge/Ag), herein also called "TAGS."

Figure 1B:
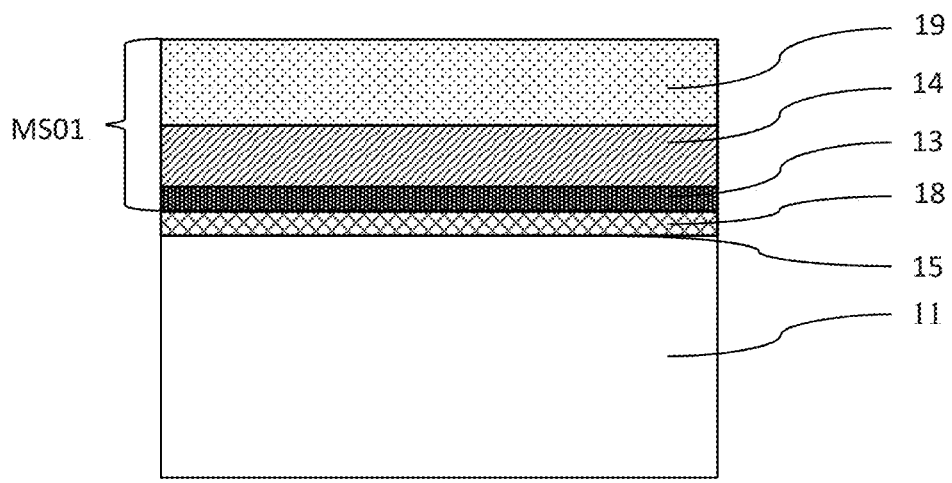
FIG. 1B includes an illustration of a thermoelectric element according to one embodiment.

In a certain embodiment, particularly when the thermoelectric body includes a material of which atoms can diffuse into the attached multi-layer contact structure, the thermoelectric element may further comprise a barrier layer (18) between the thermoelectric body and the first metal layer (13) of the multi-layer contact structure, see FIG. 1B. In one aspect, such a barrier layer may be applied if the thermoelectric material includes TAGS.

Non-limiting examples of a material of the barrier layer (18) can be tantalum (Ta), molybdenum (Mo), tellurium (Te), iridium (Ir), bismuth (Bi), or any combination thereof. In a particular embodiment, the barrier layer can include tantalum (Ta). In certain aspects, the thickness of the barrier layer can be in a range of 25 nm to 75 nm.

In one aspect, the first metal layer (13) and the second metal layer (14) can comprise the same metal, and the first metal layer (13) may have a different phase than the second metal layer (14). As used herein, the term "different phase" means that the two metal layers can be distinguished by at least one material property, for example, stress, crystallinity, density, hardness, strength, porosity, effective modulus, or any combination thereof.

In a particular aspect, the first and the second metal layer can have a different stress. As used herein, the term "stress"

refers to the residual stress. The stress can be measured, for example, by using a DEKTAK Stylus Profiler from VEECO, which analyses the stress via the bending plate method. The VEECO method described in "Thin Film Stress Measurement Using Dektak Stylus Profilers", 2004, is expressly incorporated by reference herein.

Non-limiting examples of the metal of the first metal layer (13) and of the second metal layer (14) can be nickel, copper, titanium, palladium, cobalt, molybdenum, iron, aluminum, or metal alloys. As used herein, the term "metal layer" means that a majority of the layer comprises the metal, but other non-metal additives may be also included to a minor content in the metal layer, for example, phosphorus, carbon, silicon, nitrogen, boron, or any combination thereof.

In a particular embodiment, the first metal layer (13) and the second metal layer (14) can comprise nickel. In a certain aspect, the first metal layer (13) and the second metal layer (14) can consist essentially of nickel. As used herein, the phrase "metal layer consisting essentially of nickel" means that any other ingredients or impurities next to nickel in the metal layer are not greater than 1.5 wt % or not greater than 1.0 wt %, based on the total weight of the metal layer.

In one embodiment, the first metal layer (13) can have a lower thickness than the second metal layer (14). In certain aspects, a thickness ratio (T1:T2) of the average thickness of the first metal layer (T1) to the average thickness of the second metal layer (T2) can be not greater than 0.1, such as not greater than 0.05, or not greater than 0.033, or not greater than 0.025, or not greater than 0.02, or not greater than 0.017, or not greater than 0.014.

In one aspect, the average thickness of the first metal layer (13) (T1) can be at least 10 nm, or at least 30 nm, or at least or at least 50 nm, or at least 100 nm, or at least 150 nm, or at least 200 nm. In another aspect, the average thickness of the first metal layer may be not greater than 2000 nm, or not greater than 1500 nm, or not greater than 1000 nm, or not greater than 800 nm, or not greater than 500 nm, or not greater than 300 nm. The average thickness of the first metal layer can be a value between any of the minimum and maximum values noted above.

In a further aspect, the average thickness of the second metal layer (14) (T2) can be at least 3 microns, or at least 5 microns, or at least 10 microns, or at least 50 microns, or at least 80 microns, or at least 100 microns, or at least 150 microns. In another aspect, the average thickness of the second metal layer may be not greater than 200 microns, or not greater than 180 microns, or not greater than 160 microns, or not greater than 140 microns, or not greater than 100 microns. The average thickness of the second metal layer can be a value between any of the minimum and maximum values noted above.

In a particular embodiment, the first metal layer (13) and the second metal layer (14) can include nickel, herein also called first nickel layer and second nickel layer.

In a certain particular embodiment, the first metal layer (13) and the second metal layer can consist essentially of nickel, and a stress of the second nickel layer (14) may be lower than a stress of the first nickel layer (13).

In one aspect, the stress of the first nickel layer can be at least 70 MPa, or at least 100 MPa, or at least 150 MPa, or at least 300 MPa, or at least 400 MPa, or at least, or at least 500 MPa, or at least 650 MPa, or at least 700 MPa, or at least 750 MPa, or at least 800 MPa. In another aspect, the stress of the first nickel layer may be not greater than 1500 MPa, or not greater than 1300 MPa, or not greater than 1100 MPa.

In a further aspect, the stress of the second nickel layer can be at least 5 MPa, or at least 10 MPa, or at least 50 MPa, or at least 100 MPa, or at least 150 MPa. In yet another aspect, the stress of the second nickel layer may be not greater than 630 MPa, or not greater than 600 MPa, or not greater than 550 MPa, or not greater than 500 MPa, or not greater than 450 MPa, or not greater than 400 MPa, or not greater than 350 MPa, or not greater than 300 MPa, or not greater than 150 MPa, or not greater than 100 MP, or not greater than 80 MPa.

In a certain aspect, the stress of the second metal layer (14) can be at least 50 percent lower than the stress of the first metal layer (13), such as at least 70 percent lower, at least 100 percent lower, at least 150 percent lower, or at least 200 percent lower.

Figure 2A:
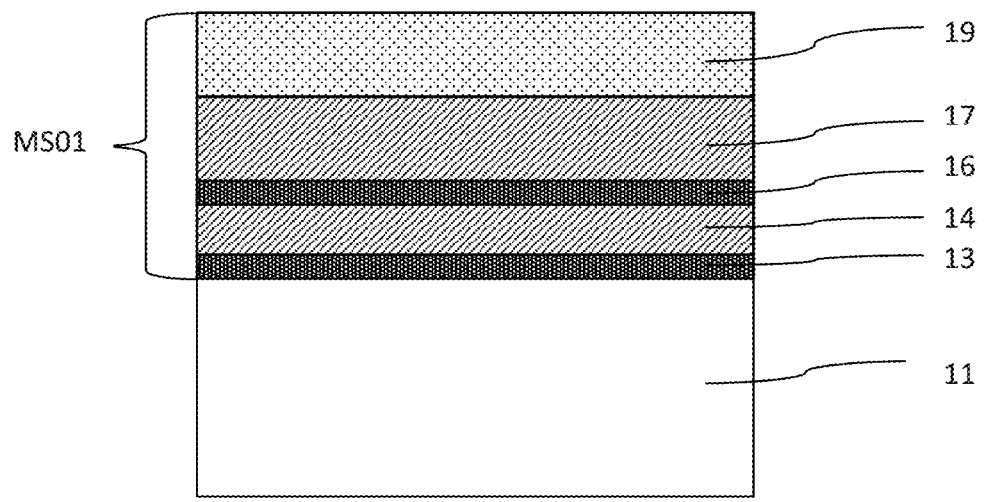
FIG. 2A includes an illustration of a thermoelectric element according to one embodiment.
Figure 2B:
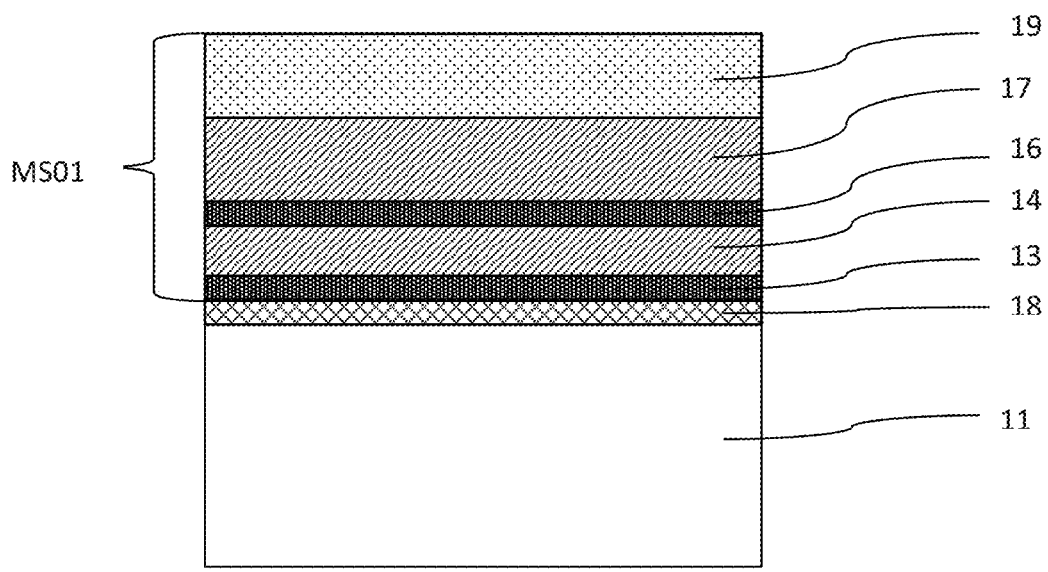
FIG. 2B includes an illustration of a thermoelectric element according to one embodiment.

In another embodiment, as illustrated in FIGS. 2A and 2B, the multi-layer contact structure of the thermoelectric element can further comprise a third metal layer (16) and a fourth metal layer (17), in addition to the first metal layer (13) and the second metal layer (14). In one aspect, the first metal layer (13), the second metal layer (14), the third metal layer (16), and the fourth metal layer (17) can all comprise the same metal. In a further aspect, the first metal layer (13) and the third metal layer (16) can have a different phase than the second metal layer (14) and the fourth metal layer (17). In a certain embodiment, all four metal layers (13), (14), (16), and (17) can comprise nickel. In a particular certain embodiment, all four metal layers (13), (14), (16), and (17) can consist essentially of nickel.

The thickness range (minimum to maximum values) of the third metal layer (16) can be the same range as described above for the first metal layer. Similarly, the thickness range of the fourth metal layer (17) can be the same range as for the second metal layer described above. In a particular embodiment, the third metal layer can have the same thickness as the first metal layer, while the fourth metal layer may be at least twice as thick as the second metal layer. In a certain aspect, the thickness of the first (13) and third (16) layer can be between 40 and 60 nm, the thickness of the second metal layer (14) may be between 3 and 7 microns, and the thickness of the fourth metal layer (17) may be between 12 and 16 microns.

FIG. 2B shows an embodiment wherein a barrier layer (18) is contained between the thermoelectric body and the first metal layer (13) of the multi-layer contact structure (MS01).

The multi-layer contact structure can further include an outer metal layer (19) which may comprise a different metal material than the first-, second-, third-, and fourth metal layers of the multi-layer contact structure. Non-limiting examples of materials of the outer metal layer can be silver, gold, indium, or platinum. In one embodiment, the outer metal layer can be a layer including silver, herein also called the silver layer. In one aspect, the silver layer (19) can directly overly the second metal layer (14), according to the embodiment shown in FIG. 1B. In another aspect, the silver layer (19) may directly overly the fourth metal layer (17), as shown in the embodiments of FIGS. 2A, 2B.

As noted above, the thermoelectric element of the present disclosure can further comprise a second multi-layer contact structure (MS2) overlying the second surface (22) of the thermoelectric body, opposite to the first surface (12).

The second multi-layer contact structure (MS2) can correspond to the first multi-layer contact structure (MS1) in amount, type, and order of the layers.

Figure 3:
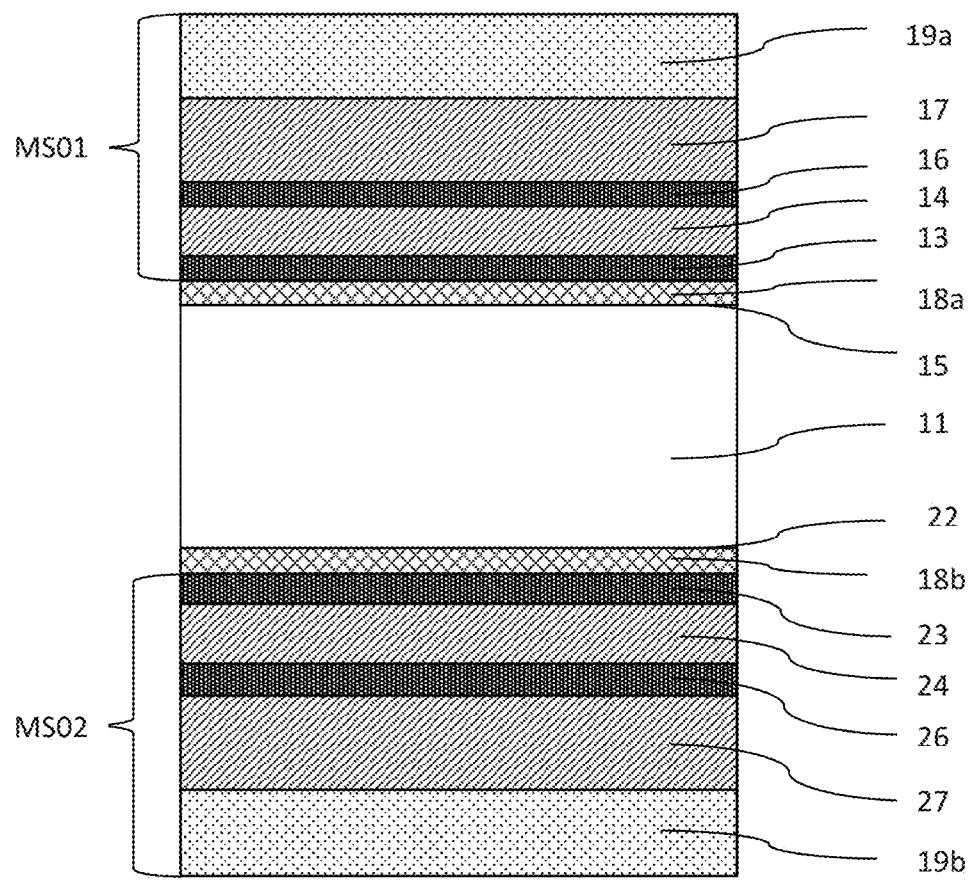
FIG. 3 includes an illustration of a thermoelectric element according to one embodiment.

In one embodiment, as illustrated in FIG. 3, the second multi-layer contact structure (MS2) can comprise a fifth metal layer (23) overlying the second surface (22) of the thermoelectric body (11), a sixth metal layer (24) directly overlying the fifth metal layer (23), a seventh metal layer (26) directly overlying the sixth metal layer (24), and an eighth metal layer (27) directly overlying the seventh metal layer (26). In a particular aspect, metal layers one to four (13), (14), (16), (17) of the first multi-metal structure (MS1) and metal layers five to eight (23), (24), (26), (27) of the second multi-layer structure (MS2) can all comprise nickel. Furthermore, metal layers five (23) and seven (26) can correspond to metal layers one (13) and three (16) in thickness and phase, while metal layers six (24) and eight (27) may correspond to metal layers two (14) and four (17) in thickness and phase.

The second multi-layer contact structure (MS02) can further include an outer metal layer which may comprise a different metal material than the other metal layers of the second multi-layer structure. In one aspect, the outer metal layer (19b) can include silver, herein also called the second layer including silver, which can correspond in thickness and material to the first layer including silver (19a) of the first multi-layer contact structure (MS01).

In another aspect, the second multi-layer contact structure (MS02) may have a different layer structure as the first multi-layer structure (MS01). For example, MS02 can have a five-layer structure and MS01 may have a three-layer structure.

In another aspect, a subsequent semiconductor (herein also called subsequent thermoelectric body) can be attached to the second surface of the thermoelectric body and a second multi-layer contact structure may be applied on an outer surface of the subsequent semiconductor. For example, in certain non-limiting embodiments, a p-type TAGS semiconductor can be combined with a subsequent semiconductor selected from a p-type PbTe, or $CeFe_4Sb_{12}$, or p-type BiTe. In other certain embodiments, an n-type PbTe semiconductor can be combined with a subsequent semiconductor selected from $CoSb_3$, or an n-type BiTe.

In a further aspect, the thermoelectric element can contain only one multi-layer contact structure overlying the first surface of the thermoelectric body, while the opposite second surface of the thermoelectric body may have a thick single-layer metal contact or a plurality of metal layers wherein each layer includes a different metal.

In a further aspect, a second barrier layer (18b) can overly the second surface (22) of the thermoelectric body and being positioned underneath the fifth metal layer (23). The second barrier layer (18b) can include the same material as the first barrier layer (18a) described above. In another aspect, the second barrier layer (18b) can include a different material than the first barrier layer (18a).

In a particular embodiment, a thermoelectric element can comprise: a thermoelectric body comprising a first surface and a second surface, the second surface being opposite to the first surface, wherein the thermoelectric body is a material including Te/Sb/Ge/Ag (TAGS); a barrier layer overlying the first surface of the thermoelectric body; a first nickel layer overlying the barrier layer; and a second nickel layer directly overlying the first nickel layer, wherein the first nickel layer has a different phase than the second nickel layer. In one aspect, the barrier layer can be tantalum. In another aspect, the thermoelectric element can further comprise a third nickel layer directly overlying the second nickel layer, and a fourth nickel layer directly overlying the third nickel layer.

In another particular embodiment, a thermoelectric element can comprise: a thermoelectric body comprising a first surface and a second surface, the second surface being opposite to the first surface, wherein the thermoelectric body comprises PbTe; a first nickel layer may overly the first surface of the thermoelectric body; and a second nickel layer can directly overly the first nickel layer. In a certain aspect, the thermoelectric element can further comprise a third nickel layer directly overlying the second nickel layer, and a fourth nickel layer directly overlying the third nickel layer.

The thermoelectric element of the present disclosure can be adapted for converting heat energy from a heat source to electrical energy, wherein the heat source can have a temperature in a range of at least 200° C. and not greater than 350° C. Furthermore, a plurality of thermoelectric elements of the present disclosure can be assembled to a thermoelectric device for converting heat energy to electrical energy in a larger scale.

The present disclosure is further directed to a method of making the above-described thermoelectric element. The method can comprise providing a thermoelectric body, and applying a first multi-layer contact structure on a first surface of the thermoelectric body, and/or a second multi-layer contact structure on a second surface of the thermoelectric body.

Applying the multi-layer contact structure of the present disclosure on a surface of the thermoelectric body can include applying a first metal layer overlying the surface of the thermoelectric body, and applying a second metal layer directly overlying the first metal layer, wherein the first metal layer and the second metal layer can include the same metal, and the first metal layer may have a different phase than the second metal layer.

In one aspect, the first and second metal layers can be applied by electroplating. It is appreciated that any other process known in the art for depositing a metal layer can be also used, for example, electroless metal plating, or dip coating, or chemical vapor deposition.

In a particular aspect, the first metal layer and the second metal layer can be formed by conducting electroplating of nickel. In order to produce nickel layers with different phases, electroplating can be conducted at different pH ranges. In one aspect, the first metal layer can be formed by electroplating of nickel at a pH between 7.5 and 8.5, while the second metal layer may be formed by electroplating of nickel at a pH between 3.5 and 4.5. In a particular aspect, the first metal layer can be formed by electroplating nickel at a pH between 7.70 and 8.06, and the second metal layer may be applied by nickel electroplating at a pH between 3.6 and 4.3.

After applying the second metal layer, a heat treatment can be conducted to strengthen the adherence of the metal layers to the thermoelectric body. The temperature of the heat treatment may be selected based on the material of the thermoelectric body, such that the maximum temperature reached in the metal layers can be close to the melting temperature of the thermoelectric material. Not being bound to theory, the heat treatment may cause a partial melting of the surface region of the thermoelectric body which can allow partial embedding and the forming of a strong bond with the overlying multi-layer contact structure.

In one aspect, the heat treatment can be performed by induction heating. Induction heating can have the advantage that a high temperature is reached in the metal layers within a very short time. The heating of the metal layers can be adapted that the heat converted from the metal layers to the thermoelectric body may only heat the surface region of the thermoelectric body for a short time to improve the adhesion of the metal layers to the body, but may not cause structural damage within the majority of the thermoelectric body.

In one aspect, the induction heating can be performed that a temperature of the heating element positioned at a distance of 1.5 mm next to the metal layers, herein also called tooling temperature, is at least 300° C. and not greater than 500° C. Such tooling temperature range can convert to a temperature within the metal layers from about 600° C. to about 1100° C.

In a particular embodiment, the heat treatment can include heating to a maximum tooling temperature of at least 320° C., or at least 340° C., or at least 360° C., or at least 380° C., or at least 400° C., or at least 420° C., or at least 440° C. In another embodiment, the maximum tooling temperature of the heat treatment may be not greater than 440° C. or not greater than 420° C. or not greater than 400° C. or not greater than 380° C. or not greater than 360° C. or not greater than 340° C.

In a particular aspect, induction heating can be conducted at a lower preheat tooling temperature in a range of between 100° C. and 175° C. for about 100-150 seconds, followed by a high tooling temperature treatment at Tmax for not longer than 10 seconds, followed by free cooling.

In one aspect, the induction heating can cause a heating of the nickel layers to at least 600° C., such as at least 630° C., at least 650° C., at least 700° C., at least 750° C., or at least 800° C., or at least 900° C. In another aspect, the temperature of the nickel layers may be not greater than 1100° C., or not greater than 1000° C., or not greater than 950° C., or not greater than 920° C., or not greater than 900° C., or not greater than 850° C., or not greater than 800° C., or not greater than 750° C., or not greater than 700° C., or not greater than 650° C.

In one embodiment, after the heat treatment, a third metal layer can be applied directly overlying the second metal layer, and a fourth metal layer may be applied directly overlying the third metal layer. In a particular aspect, the third and fourth metal layers may be applied in the same way as the first and second metal layers are applied, and accordingly can correspond in material and phase to the first and second metal layers, respectively.

To prevent the diffusion of atoms from the thermoelectric body into the multi-layer contact structure, a barrier layer can be applied before the first metal layer of the multi-layer contact structure is applied. The barrier layer can be applied, for example, if the material of the thermoelectric body includes TAGS. In a particular embodiment, the barrier layer can include tantalum and may be applied by physical vapor deposition (PVD).

In a further embodiment, an outer metal layer can be applied on the fourth nickel layer, wherein the outer layer can include a different metal than the first-, second-, third-, and fourth metal layers of the multi-layer contact structure. In one aspect, the outer layer of the multi-layer contact structure can be a layer including silver, herein also called the silver layer. In a certain aspect, the silver layer can be applied by electro-deposition from a silver salt solution.

The method of the present disclosure can further include applying a second multi-layer contact structure overlying the second surface of the thermoelectric body, opposite to the first surface. In one embodiment, the second multi-layer contact structure can contain the same layer structure as the first multi-layer structure. In a particular embodiment, the second multi-layer contact structure can be concurrently formed with the first multi-layer contact structure.

In one aspect, the metal electroplating can be conducted under the condition that the plating bath can have a high resistance, while the thermoelectric body placed within the plating bath, herein also called a wafer, may have a low resistance. To achieve a low wafer resistance, a high precision resistor can be positioned between the voltage source and the wafer, wherein the high precision resistor is selected that the resistance of the high precision resistor is at least 10,000 times greater than the desired resistance of the wafer (cathode), according to the following equation (1): $r \times 10,000 < R$ (1), with R being the resistance of the precision resistor, and r being the resistance of the wafer.

Figure 4:
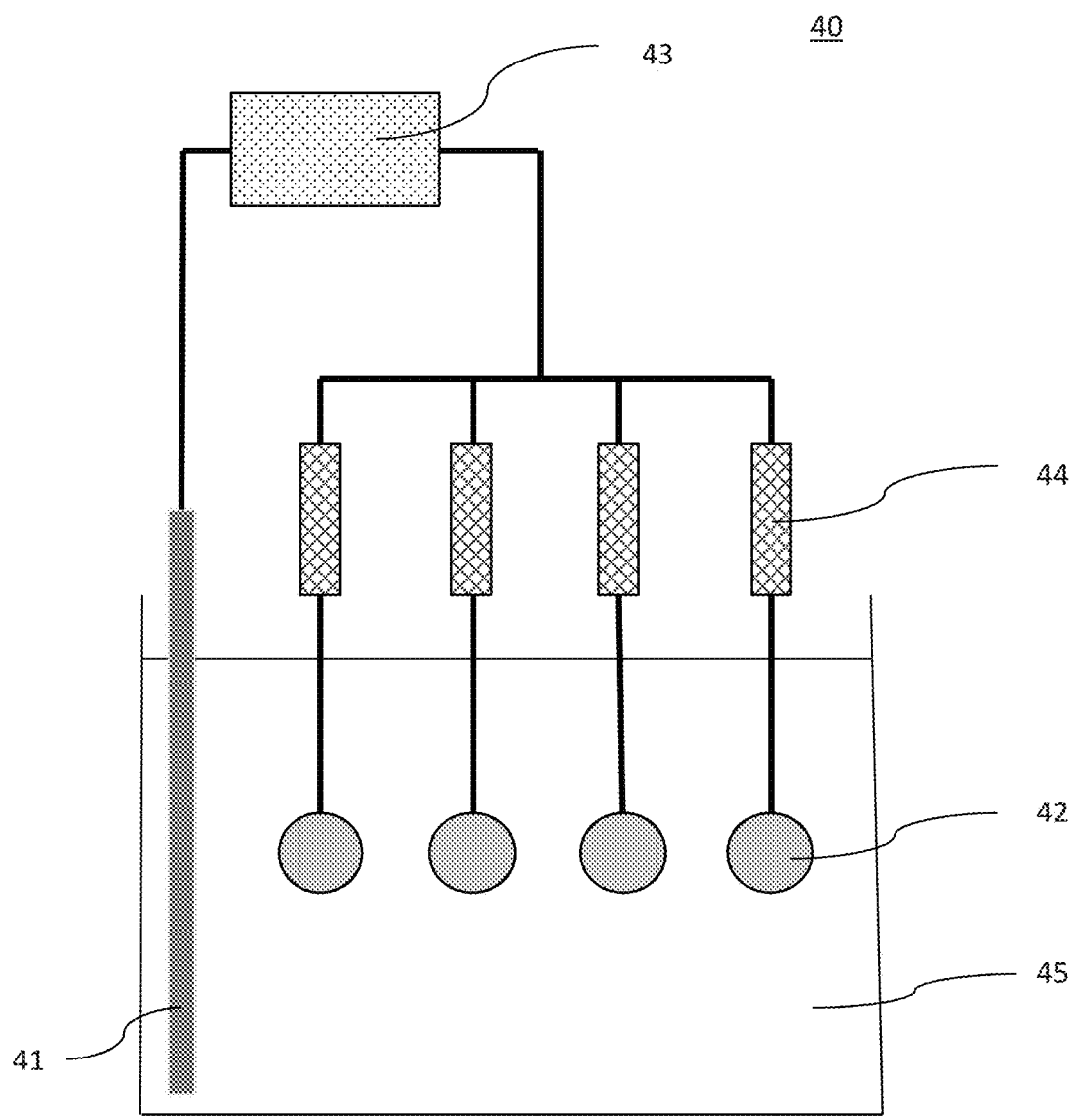
FIG. 4 includes an illustration of an electroplating system according to one embodiment.

In a certain particular embodiment, as illustrated in FIG. 4, a metal plating system (40) can comprise an anode (41), and a plurality of wafers (42), wherein the wafers may function as a cathode to be plated. The plurality of wafers (42) can be positioned parallel to each other within the plating bath (45) and may be all connected to one voltage source (43), wherein between each wafer (42) and the voltage source (43) a precision resistor (44) may be placed. The system can be designed that the above-described equation (1) applies. It has been surprisingly observed that such a metal plating system may achieve a very even coating quality between different thermoelectric elements. The plating method and system allowed to produce a plurality of thermoelectric elements, wherein a variation of the coating thickness between different thermoelectric elements may be not greater than factor 2, or not greater than factor 1.8, or not greater than factor 1.5 or not greater than factor 1.3.

As further demonstrated in the examples, the above-described method can produce thermoelectric elements with strong and high stress tolerating contact structures which can provide a long lifetime of the thermoelectric elements.

Many different aspects and embodiments are possible. Some of those aspects and embodiments are described herein. After reading this specification, skilled artisans will appreciate that those aspects and embodiments are only illustrative and do not limit the scope of the present invention. Embodiments may be in accordance with any one or more of the embodiments as listed below.

EMBODIMENTS

Embodiment 1. A thermoelectric element, comprising:
a thermoelectric body comprising a first surface and a second surface, the first surface being opposite to the second surface; and
a first multi-layer contact structure, the first multi-layer contact structure comprising a first metal layer and a second metal layer, wherein
the first metal layer is overlying the first surface of the thermoelectric body and the second metal layer is directly overlying the first metal layer;
the first metal layer and the second metal layer comprise the same metal; and
the first metal layer has a different phase than the second metal layer.

Embodiment 2. The thermoelectric element of embodiment 1, wherein the first multi-layer contact structure further comprises a third metal layer and a fourth metal layer, wherein
the third metal layer is directly overlying the second metal layer and the fourth metal layer is directly overlying the third metal layer;
the first metal layer, the second metal layer, the third metal layer, and the fourth metal layer comprise the same metal, and
the first metal layer and the third metal layer have a different phase than the second metal layer and the fourth metal layer.

Embodiment 3. The thermoelectric element of embodiment 1, wherein the first metal layer and the second metal layer comprise nickel.

Embodiment 4. The thermoelectric element of embodiment 3, wherein the first metal layer and the second metal layer consist essentially of nickel.

Embodiment 5. The thermoelectric element of embodiment 2, wherein each of the first metal layer, the second metal layer, the third metal layer, and the fourth metal layer comprises nickel.

Embodiment 6. The thermoelectric element of embodiment 5, wherein each of the first metal layer, the second metal layer, the third metal layer, and the fourth metal consists essentially of nickel.

Embodiment 7. The thermoelectric element of any one of the preceding embodiments, wherein a thickness ratio (T1:T2) of an average thickness of the first metal layer (T1) to an average thickness of the second metal layer (T2) is not greater than 0.1, such as not greater than 0.05, not greater than 0.033, not greater than 0.025, not greater than 0.02, not greater than 0.017, or not greater than 0.014.

Embodiment 8. The thermoelectric element of any one of the preceding embodiments, wherein an average thickness of the first metal layer is at least 10 nm or at least 30 nm or at least or at least 50 nm or at least 100 nm, or at least 150 nm or at least 200 nm.

Embodiment 9. The thermoelectric element of any one of the preceding embodiments, wherein an average thickness of the first metal layer is not greater than 2000 nm or not greater than 1500 nm or not greater than 1000 nm or not greater than 800 nm or not greater than 500 nm or not greater than 300 nm.

Embodiment 10. The thermoelectric element of any one of the preceding embodiments, wherein an average thickness of the second metal layer is at least 3 microns or at least 5 microns, or at least 10 microns, or at least 50 microns, or at least 80 microns, or at least 100 microns, or at least 150 microns.

Embodiment 11. The thermoelectric element of any one of the preceding embodiments, wherein an average thickness of the second metal layer is not greater than 200 microns, or not greater than 180 microns, or not greater than 160 microns, or not greater than 140 microns, or not greater than 120 microns, or not greater than 100 microns, or not greater than 50 microns, or not greater than 30 microns.

Embodiment 12. The thermoelectric element of any one of the preceding embodiments, wherein a stress of the first metal layer is greater than a stress of the second metal layer.

Embodiment 13. The thermoelectric element of embodiment 12, wherein the stress of the first metal layer is at least 70 MPa, or at least 100 MPa, or at least 150 MPa, or at least 300 MPa, or at least 400 MPa, or at least 500 MPa, or at least 600 MPa, or at least 700 MPa, or at least 750 MPa, or at least 800 MPa, or at least 850 MPa, or at least 900 MPa, or at least 1000 MPa, and not greater than 1500 MPa, or not greater than 1300 MPa, or not greater than 1100 MPa; and the stress of the second metal layer is at least 5 MPa, or at least 10 MPa, or at least 50 MPa, or at least 100 MPa, and not greater than 600 MPa, or not greater than 550 MPa, or not greater than 500 MPa, or not greater than 450 MPa, or not greater than 400 MPa, or not greater than 350 MPa, or not greater than 300 MPa, or not greater than 150 MPa, or not greater than 100 MPa, or not greater than 80 MPa.

Embodiment 14. The thermoelectric element of any one of embodiments 2 and 5-13, wherein a thickness ratio of the third metal layer to the fourth metal layer is not greater than 0.1, such as not greater than 0.05, not greater than 0.033, not greater than 0.025, not greater than 0.02, not greater than 0.017, or not greater than 0.014.

Embodiment 15. The thermoelectric element of any one of embodiments 2 and 5-14, wherein an average thickness of the third metal layer is at least 10 nm, or at least 30 nm, or at least 50 nm, or at least 100 nm, or at least 150 nm or at least 200 nm.

Embodiment 16. The thermoelectric element of any one of embodiments 2 and 5-15, wherein an average thickness of the third metal layer is not greater than 2000 nm, or not greater than 1500 nm, or not greater than 1000 nm, or not greater than 800 nm, or not greater than 500 nm, or not greater than 300 nm.

Embodiment 17. The thermoelectric element of any one of embodiments 2 and 5-16, wherein an average thickness of the fourth metal layer is at least 5 microns, or at least 10 microns, or at least 50 microns, or at least 80 microns, or at least 100 microns, or at least 150 microns.

Embodiment 18. The thermoelectric element of any one of embodiments 2 and 5-17, wherein an average thickness of the fourth metal layer is not greater than 200 microns, or not greater than 180 microns, or not greater than 160 microns, or not greater than 140 microns, or not greater than 120 microns.

Embodiment 19. The thermoelectric element of any one of the preceding embodiments, further comprising a first barrier layer between the first surface of the thermoelectric body and the first multi-layer contact structure.

Embodiment 20. The thermoelectric element of embodiment 19, wherein the first barrier layer includes tantalum, molybdenum, tellurium, iridium, or bismuth.

Embodiment 21. The thermoelectric element of embodiment 20, wherein the barrier layer includes tantalum.

Embodiment 22. The thermoelectric element of any one of the preceding embodiments, wherein the first multi-layer contact structure further comprises a first layer including silver as an outer layer.

Embodiment 23. The thermoelectric element of any one of the preceding embodiments, further comprising a second multi-layer contact structure, the second multi-layer contact structure overlying the second surface of the thermoelectric body, wherein the second multi-layer contact structure comprises a same layer structure as the first multi-layer contact structure.

Embodiment 24. The thermoelectric element of embodiment 23, wherein the second multi-layer contact structure comprises:
   a fifth metal layer overlying the second surface of the thermoelectric body;
   a sixth metal layer directly overlying the fifth metal layer;
   a seventh metal layer directly overlying the sixth metal layer; and
   an eighth metal layer directly overlying the seventh metal layer.

Embodiment 25. The thermoelectric element of embodiments 23 or 24, further comprising a second barrier layer between the second surface of the thermoelectric body and the second multi-layer contact structure.

Embodiment 26. The thermoelectric element of embodiment 25, wherein the second barrier layer includes tantalum, molybdenum, tellurium, iridium, or bismuth.

Embodiment 27. The thermoelectric element of embodiment 26, wherein the second barrier layer includes tantalum.

Embodiment 28. The thermoelectric element of embodiments 22-27, wherein the second multi-layer contact structure further comprises a second layer including silver as an outer layer.

Embodiment 29. The thermoelectric element of any one of the preceding embodiments, wherein the thermoelectric body comprises an n-type semiconductor material.

Embodiment 30. The thermoelectric element of any one of the preceding embodiments, wherein the thermoelectric body comprises a material including lead telluride (PbTe).

Embodiment 31. The thermoelectric element of any one of embodiments 1-28, wherein the thermoelectric body comprises a P-type semiconductor material.

Embodiment 32. The thermoelectric element of any one of embodiments 1-28, wherein the thermoelectric body comprises a material including Te/Sb/Ge/Ag (TAGS).

Embodiment 33. A method of making a thermoelectric element, comprising:
providing a thermoelectric body, the thermoelectric body comprising a first surface and a second surface, the second surface being opposite to the first surface;
applying a first multi-layer contact structure overlying the first surface of the thermoelectric body, wherein applying the first multi-layer contact structure comprises:
applying a first metal layer overlying the first surface of the thermoelectric body; and
applying a second metal layer directly overlying the first metal layer,
wherein the first metal layer and the second metal layer comprise the same metal; and the first metal layer has a different phase than the second metal layer; and
conducting a heat treatment after applying the second metal layer, wherein the heat treatment includes heating the first and second metal layers to a temperature of at least 600° C.

Embodiment 34. The method of embodiment 33, wherein applying the first multi-layer contact structure further comprises:
applying after the heat treatment a third metal layer directly overlying the second metal layer; and
applying a fourth metal layer directly overlying the third metal layer,
wherein
the first metal layer, the second metal layer, the third metal layer, and the fourth metal layer comprise the same metal; and
the first metal layer and the third metal layer have a different phase than the second metal layer and the fourth metal layer.

Embodiment 35. The method of embodiment 34, wherein the heat treatment includes heating to a temperature of at least 650° C., or at least 700° C., or at least 750° C., or at least 800° C., or at least 850° C., or at least 900° C.

Embodiment 36. The method of embodiments 34 or 35, wherein the heat treatment includes heating to a temperature not greater than 1100° C. or not greater than 1050° C. or not greater than 1000° C. or not greater than 950° C. or not greater than 930° C., or not greater than 900° C. or not greater than 800° C. or not greater than 700° C. or not greater than 650° C.

Embodiment 37. The method of any one of embodiments 34-36, wherein the heat treatment is conducted by induction heating.

Embodiment 38. The method of any one of embodiments 34-37, wherein the heat treatment is conducted not longer than 20 seconds, or not longer than 15 seconds, or not longer than 12 seconds, or not longer than 10 seconds, or not longer than 8 seconds, or not longer than 5 seconds.

Embodiment 39. The method of any one of embodiments 34-38, wherein the first metal layer, the second metal layer, the third metal layer, and the fourth metal layer comprise nickel.

Embodiment 40. The method of embodiment 39, wherein the first metal layer, the second metal layer, the third metal layer, and the fourth metal layer consist essentially of nickel.

Embodiment 41. The method of any one of embodiments 34-40, wherein applying the first metal layer, the second metal layer, the third metal layer, and the fourth metal layer comprise electroplating.

Embodiment 42. The method of embodiment 41, wherein electroplating of the first metal layer and the third metal-containing is conducted at a different pH than electroplating of the second metal layer and the fourth metal layer.

Embodiment 43. The method of embodiment 42, wherein electroplating of the first metal layer and the third metal layer is conducted at a pH of at least 7.5 and not greater than 8.5, and electroplating of the second metal layer and of the fourth metal layer is conducted at a pH of at least 3.5 and not greater than 4.5.

Embodiment 44. The method of any one of embodiments 33-43, further comprising applying a first barrier layer overlying the first surface of the thermoelectric body before applying the first metal layer.

Embodiment 45. The method of embodiment 44, wherein the first barrier layer includes tantalum, molybdenum, tellurium, iridium, or bismuth.

Embodiment 46. The method of embodiment 45, wherein the first barrier layer includes tantalum.

Embodiment 47. The method of any one of embodiments 33-46, further comprising applying a first layer including silver as an outer layer of the first multi-layer contact structure.

Embodiment 48. The method of embodiment 47, wherein the first layer including silver is applied by electroplating.

Embodiment 49. The method of any one of embodiments 33-48 further comprising applying a second multi-layer contact structure overlying the second surface of the thermoelectric body, wherein the second multi-layer contact structure comprises a same layer structure as the first multi-layer contact structure.

Embodiment 50. The method of embodiment 49, wherein the second multi-layer contact structure is concurrently formed with the first multi-layer contact structure.

Embodiment 51. The method of embodiments 49 or 50, wherein the second multi-layer contact structure comprises:
a fifth metal layer overlying the second surface of the thermoelectric body;
a sixth metal layer directly overlying the fifth metal layer;
a seventh metal layer directly overlying the sixth metal layer; and
an eighth metal layer directly overlying the seventh metal layer.

Embodiment 52. The method of embodiment 51, further comprising applying a second barrier layer overlying the second surface of the thermoelectric body before applying the fifth metal layer.

Embodiment 53. The method of embodiment 52, wherein the second barrier layer includes tantalum, molybdenum, tellurium, iridium, or bismuth.

Embodiment 54. The method of embodiment 53, wherein the second barrier layer comprises tantalum (Ta).

Embodiment 55. The method of any one of embodiments 49-54, further comprising applying a second layer including silver overlying the second multi-layer contact structure.

Embodiment 56. The method of embodiment 55, wherein the second layer including silver is applied by electroplating.

Embodiment 57. The method of any one of embodiments 33-56, wherein the thermoelectric body comprises a material including PbTe.

Embodiment 58. The method of any one of embodiments 33-56, wherein the thermoelectric body comprises a material including Te/Sb/Ge/Ag (TAGS).

Embodiment 59. A thermoelectric element, comprising:
a thermoelectric body comprising a first surface and a second surface, the second surface being opposite to the first surface, wherein the thermoelectric body comprises PbTe;
a first nickel layer overlying the first surface of the thermoelectric body; and a
a second nickel layer directly overlying the first nickel layer,
wherein the first nickel layer has a different phase than the second nickel layer.

Embodiment 60. A thermoelectric element, comprising:
a thermoelectric body comprising a first surface and a second surface, the second surface being opposite to the first surface, wherein the thermoelectric body comprises a material including Te/Sb/Ge/Ag (TAGS);
a barrier layer overlying the first surface of the thermoelectric body;
a first nickel layer overlying the barrier layer; and
a second nickel layer directly overlying the first nickel layer,
wherein the first nickel layer has a different phase than the second nickel layer.

Embodiment 61. The thermoelectric element of embodiment 60, wherein the barrier layer comprises tantalum.

Embodiment 62. The thermoelectric element or method of any one of the preceding embodiments, wherein the thermoelectric element is adapted for converting heat energy from a heat source to electrical energy, the heat source having a temperature of at least 200° C. and not greater than 350° C.

Embodiment 63. A thermoelectric device, comprising a plurality of the thermoelectric element according to any one of the preceding embodiments.

EXAMPLES

The following non-limiting examples illustrate the present invention.

Example 1

Preparing of a thermoelectric element comprising a thermoelectric body including PbTe.

A round thermoelectric body including n-type doped lead telluride (PbTe) having a diameter of 20 mm and a wafer thickness of 2 mm, was polished on both surfaces using a mechanical polisher with an 800 grits polishing pad to obtain a smooth outer surface having a surface roughness between 10 to 15 microns.

After the polishing, the surface of the PbTe body was etched using a 2:1 water to nitric acid treatment solution for 1 minute in order to remove about 2-10 microns from the outer surface and to activate the surface towards nickel plating. Following the etching, the surface was cleaned with de-ionized water and dried with dry nitrogen spray at room temperature.

The surface-etched PbTe body was subjected to a first nickel electroplating to deposit a first nickel layer having a thickness of about 50 nm. The electroplating of the first nickel layer was conducted using the plating system and conditions described below, wherein the plating bath was adjusted to a pH of about 8.0.

After electroplating the first nickel layer, the plating bath was changed, by using a bath having the same ingredients but an adjusted pH of about 4.0, and a second nickel electroplating was conducted by depositing a second nickel layer having a thickness of about 5 microns.

After plating the second nickel layer, the PbTe body was subjected to a heat treatment regime, by placing the body in an annealing oven chamber containing induction heating elements. First, a preheating was conducted by heating the induction heating elements (herein also called tooling) to a temperature of 150° C. and holding the temperature for about 160 seconds at this temperature. Thereafter, induction heating was conducted by heating the tooling to a temperature of about 450° C. for 10 seconds. The tooling was positioned at a distance of 1.5 mm next to the wafer. The use of induction heating elements allowed a rapid thermal annealing of the first and second nickel layers to a temperature of about 920° C. of the nickel layers and strengthening the attachment of the nickel layers to the thermoelectric body. The temperature of the nickel layers was measured using an IR temperature probe and measuring the temperature on the surface of the second nickel layer.

Following the heat treatment, a third nickel layer having a thickness of about 50 nm was directly electroplated on the second nickel layer. The electroplating of the third nickel layer was conducted the same way as the plating of the first nickel layer at a pH of 8.0.

Thereafter, a fourth nickel layer having a thickness of about 15 microns was directly plated on the third nickel layer. The electroplating of the fourth nickel layer was conducted the same way as the plating of the second nickel layer at a pH of 4.0.

After electroplating of the fourth nickel layer, a silver layer having a thickness of about 15 microns was deposited on top of the fourth nickel layer from an AgCN bath.

The four nickel layers and the silver layer were all applied concurrently on both surfaces of the PbTe body, which are herein called a first multi-layer contact structure (MS1) and a second multi-layer contact structure (MS2), such that each multi-layer structure contained five layers, and a symmetrical thermoelectric element was obtained, as shown in FIG. 3.

Nickel Electroplating

The plating system used for electroplating the nickel layers is illustrated in FIG. 4. The plating system contained a nickel anode (41), and a 400 ml plating bath, into which a plurality of four thermoelectric bodies (42), herein also called wafers, were inserted. The plating bath contained nickel sulphamate (150 g/l based on Ni metal), nickel bromide (220 g/l), boric acid (40 g/l), wetting agent (2 ml/l HN-5), and the balance water. The temperature of the plating bath during the plating was at laboratory room temperature of 23-25° C. The four wafers (42) were placed parallel to each other and connected to a voltage source (43). Between each wafer (42) and the voltage source (43) was placed a precision resistor (44). The electroplating was conducted under the condition that the plating bath (45) had a high resistance of about 500 Ohm, while the wafers (42) had a low resistance. The resistance of the wafers (42) was in a range of 0.1 to 0.5 mOhm and was more than 10,000 times lower than the resistance of the precision resistors (44), such that the following equation (1) applied: r×10,000<R (1), with R being the resistance of the precision resistor (43), and r being the resistance of the wafer (41).

By using the above-described plating system, it was possible to form uniform layers on non-uniform substrates (wafers). For example, if wafers had a resistance span of 0.1 to 0.5 mOhm, uniform nickel layers of a controlled thickness between 1-20 microns could be formed, with minor thickness variation.

Example 2

Preparing of a thermoelectric element comprising a thermoelectric body including TAGS.

A round thermoelectric body including a TAGS material and having a diameter of 20 mm and a thickness of 2 microns was polished on both surfaces with a mechanical polisher containing an 800 grits polishing pad to obtain a smooth outer surface having a surface roughness between 10 to 15 microns.

After the polishing, the TAGS body was heat treated in an oven at a temperature of 300° C. for 0.5 hours to remove any remaining moisture.

Following the heat treatment, the surface of the TAGS body was lightly etched using a 2:1:1:1 (nitric acid:glacial acetic acid:hydrogen peroxide) bath for 20 minutes in a sonicator in order to remove residual contaminants from the outer surface and to activate the surface towards nickel plating. Following the etching, the surface was cleaned with de-ionized water using a water jet for 15-20 seconds and dried at laboratory room temperature (23-25° C.).

The surface-etched TAGS body was subjected to physical vapor deposition (PVD) to deposit a tantalum layer having a thickness of about 50 nm. At the end of the tantalum deposition, the PVD machine further deposited 5-10 nm of nickel to protect the tantalum.

After PVD depositing of the tantalum layer, a first nickel layer having a thickness of about 50 nm was plated directly on the tantalum layer, followed by plating a second nickel layer with a thickness of about 5 microns on the first nickel layer. The plating of the first and second nickel layers was conducted the same way as described in Example 1.

The TAGS body containing the tantalum barrier layer and the first and second nickel layers was subjected to a heat treatment regime, by placing the body in an annealing oven containing induction heating elements. First, a preheating was conducted by heating the tooling to a temperature of 150° C. and holding the temperature for about 160 seconds at this temperature. Thereafter, induction heating was conducted by heating the tooling of the oven to a temperature of about 320° C. and holding the temperature for about 10 seconds, which caused a heating of the nickel layers to a temperature of about 630° C. and strengthening the adhesion of the multi-layer contact structure to the TAGS body.

Following the heat treatment, a third nickel layer was plated on the second nickel layer, and a fourth nickel layer was plated on the third nickel layer. The third and fourth nickel layers were applied the same way as described in Example 1.

Similarly, as in Example 1, after the electroplating of the fourth nickel layer, a silver layer having a thickness of about 15 microns was deposited on top of the fourth nickel layer.

The tantalum layer, the four nickel layers, and the silver layer were applied concurrently on both surfaces of the TAGS body.

Example 3

Testing of the Life-Time/Performance of the Thermoelectric Elements.

The thermoelectric elements of Examples 1 and 2 were subjected to high temperature cycles and the maximum power at the peak temperature was measured during each cycle. The lifetime of a thermoelectric element was defined as the number of cycles needed that the maximum power measured during the first cycle decreased by 15% or more.

The thermoelectric elements of Examples 1 and 2 had a ten times higher lifetime than comparative thermoelectric elements that were made using the same thermoelectric bodies as in Examples 1 and 2, but having a multi-layer contact layer structure of a nickel (1 micron)/silver (8 microns)/indium (5 microns), and without heat treatment.

Furthermore, the thermoelectric elements of Examples 1 and 2 had about ten times higher life-time compared to thermoelectric elements which were made without the induction heating after applying the first and second nickel layer but were otherwise made in the same way and with the same materials as described in Examples 1 and 2.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of the invention.

What is claimed is:
1. A thermoelectric element, comprising:
a thermoelectric body comprising a first surface and a second surface, the first surface being opposite to the second surface; and
a first multi-layer contact structure, the first multi-layer contact structure comprising a first metal layer and a second metal layer, wherein
the first metal layer is overlying the first surface of the thermoelectric body and the second metal layer is directly overlying the first metal layer;
the first metal layer and the second metal layer comprise the same metal;
the first metal layer has a different phase than the second metal layer; and
an average thickness of the first metal layer (T1) is at least 10 nm and not greater than 500 nm, and an average thickness of the second metal layer (T2) is at least 3 microns and not greater than 150 microns,
and wherein the first multi-layer contact structure further comprises a third metal layer and a fourth metal layer, wherein
the third metal layer is directly overlying the second metal layer and the fourth metal layer is directly overlying the third metal layer;
the first metal layer, the second metal layer, the third metal layer, and the fourth metal layer comprise the same metal, and
the first metal layer and the third metal layer have a different phase than the second metal layer and the fourth metal layer,
and wherein the multi-layer contact structure further comprises a layer including silver, gold, indium, or platinum directly overlying the fourth metal layer.

2. The thermoelectric element of claim 1, wherein each of the first metal layer, the second metal layer, the third metal layer, and the fourth metal layer consists essentially of nickel.

3. The thermoelectric element of claim 1, wherein a thickness ratio (T1:T2) of an average thickness of the first metal layer (T1) to an average thickness of the second metal layer (T2) is not greater than 0.1.

4. The thermoelectric element of claim 2, wherein a stress of each of the first metal layer and the third metal layer is greater than a stress of each of the second metal layer and the fourth metal layer.

5. The thermoelectric element of claim 4, wherein the stress of each of the first metal layer and the third metal layer is at least 70 MPa and not greater than 1500 MPa, and the stress of each of the second metal layer and of the fourth metal layer is at least 5 MPa and not greater than 600 MPa.

6. The thermoelectric element of claim 1, further comprising a second multi-layer contact structure, the second multi-layer contact structure overlying the second surface of the thermoelectric body, wherein the second multi-layer contact structure comprises a same layer structure as the first multi-layer contact structure.

7. The thermoelectric element of claim 1, wherein the thermoelectric body comprises an n-type semiconductor material or a p-type semiconductor material.

8. The thermoelectric element of claim 7, wherein the thermoelectric body comprises n-type lead telluride (PbTe).

9. The thermoelectric element of claim 7, wherein the thermoelectric body comprises p-type Te/Sb/Ge/Ag (TAGS).

10. The thermoelectric element of claim 1, wherein the thermoelectric element is adapted for converting heat energy from a heat source to electrical energy, the heat source having a temperature of at least 200° C. and not greater than 350° C.

11. A method of making a thermoelectric element, comprising:
providing a thermoelectric body, the thermoelectric body comprising a first surface and a second surface, the second surface being opposite to the first surface;
applying a first multi-layer contact structure overlying the first surface of the thermoelectric body, wherein applying the first multi-layer contact structure comprises:
applying a first metal layer overlying the first surface of the thermoelectric body;
applying a second metal layer directly overlying the first metal layer, wherein an average thickness of the first metal layer (T1) is at least 10 nm and not greater than 500 nm, and an average thickness of the second metal layer (T2) is at least 3 microns and not greater than 150 microns;
conducting a heat treatment after applying the second metal layer;
applying after the heat treatment a third metal layer directly overlying the second metal layer;
applying a fourth metal layer directly overlying the third metal layer; and
applying a layer including silver, gold, indium, or platinum directly overlying the fourth metal layer,
wherein
the first metal layer, the second metal layer, the third metal layer, and the fourth metal layer comprise the same metal; and
the first metal layer and the third metal layer have a different phase than the second metal layer and the fourth metal layer, and
wherein the heat treatment includes heating the first and second metal lavers to a temperature of at least 600° C.

12. The method of claim 11, wherein the heat treatment is conducted by induction heating.

13. The method of claim 11, wherein each of the first metal layer, the second metal layer, the third metal layer, and the fourth metal layer consist essentially of nickel.

14. The method of claim 11, wherein applying the first metal layer and the third metal layer comprises nickel electroplating at a pH of at least 7.5 and not greater than 8.5, and applying the second metal layer and the fourth metal layer comprises nickel electroplating at a pH of at least 3.5 and not greater than 4.5.

15. The method of claim 11, further comprising applying a second multi-layer contact structure overlying the second surface of the thermoelectric body, wherein the second multi-layer contact structure comprises a same layer structure as the first multi-layer contact structure.

16. The method of claim 15, wherein the second multi-layer contact structure is concurrently formed with the first multi-layer contact structure.

* * * * *